US009509445B2

United States Patent
Hammerschmidt et al.

(10) Patent No.: US 9,509,445 B2
(45) Date of Patent: Nov. 29, 2016

(54) SENSOR INTERFACE THAT PROVIDES A LONG PACKAGE CRC TO IMPROVE FUNCTIONAL SAFETY

(71) Applicant: Infineon Technologies AG, Neubiberg (DE)

(72) Inventors: Dirk Hammerschmidt, Villach (AT); Wolfgang Scherr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 99 days.

(21) Appl. No.: 14/606,472

(22) Filed: Jan. 27, 2015

(65) Prior Publication Data

US 2016/0218828 A1    Jul. 28, 2016

(51) Int. Cl.

| H04L 1/00 | (2006.01) |
|---|---|
| F02D 41/28 | (2006.01) |
| H03M 13/29 | (2006.01) |
| H03M 13/09 | (2006.01) |
| H04L 29/08 | (2006.01) |
| H03M 13/11 | (2006.01) |
| H03M 13/15 | (2006.01) |
| H03M 13/19 | (2006.01) |

(52) U.S. Cl.
CPC ............ *H04L 1/0061* (2013.01); *H03M 13/09* (2013.01); *H03M 13/096* (2013.01); *H03M 13/1102* (2013.01); *H03M 13/1515* (2013.01); *H03M 13/19* (2013.01); *H03M 13/29* (2013.01); *H04L 1/0045* (2013.01); *H04L 67/12* (2013.01); *F02D 2041/281* (2013.01); *G05B 2219/25157* (2013.01)

(58) Field of Classification Search
CPC ...................... F02D 2041/281; H04L 1/0061; G05B 2219/25157
See application file for complete search history.

(56) References Cited

U.S. PATENT DOCUMENTS

| 5,526,267 | A | * | 6/1996 | Sogawa | F02D 41/266 123/479 |
|---|---|---|---|---|---|
| 5,598,543 | A | * | 1/1997 | Notarianni | G06F 1/1632 370/473 |
| 5,955,969 | A | * | 9/1999 | D'Hont | G08G 1/017 235/384 |
| 5,959,568 | A | * | 9/1999 | Woolley | G01S 5/0289 235/385 |
| 6,012,839 | A | * | 1/2000 | Nguyen | G06F 11/1004 714/755 |
| 6,081,570 | A | * | 6/2000 | Ghuman | H04J 3/0605 370/514 |
| 6,167,338 | A | * | 12/2000 | De Wille | G11C 7/20 701/33.4 |
| 6,385,210 | B1 | * | 5/2002 | Overberg | H04L 12/413 370/447 |
| 6,647,528 | B1 | * | 11/2003 | Collette | H04L 1/0045 714/758 |
| 7,464,203 | B2 | * | 12/2008 | Katrak | H04L 1/0041 358/1.18 |

(Continued)

OTHER PUBLICATIONS

SAE International—Surface Vehicle Information Report. "SENT—Single Edge Nibble Transmission for Automotive Applications." SAE International. Jan. 2010.

*Primary Examiner* — Joseph D Torres
(74) *Attorney, Agent, or Firm* — Eschweller & Associates, LLC

(57) ABSTRACT

A data transmission system comprising an Automotive Sensor Network System (ASNS) connected to a plurality of source locations via a common bus, wherein the ASNS is configured to ascertain the source from which the data-frames and first package checksum are received and based on the ascertainment of the source, appropriate decoding methods are used to calculate the ASNS location data-frame checksums and the ASNS location package checksums. A higher order redundancy check is done over a series of data-frames to detect errors in the reception caused by temporary high interference that may exist in the transmission path.

29 Claims, 10 Drawing Sheets

(56) References Cited

U.S. PATENT DOCUMENTS

| | | | | |
|---|---|---|---|---|
| 7,511,608 B2* | 3/2009 | Nornes | ............... | B60C 23/0416 340/445 |
| 7,882,424 B2* | 2/2011 | Forest | ................... | H04L 1/0061 714/746 |
| 7,953,536 B2* | 5/2011 | Katrak | ............... | G06F 11/1608 340/436 |
| 8,103,946 B2* | 1/2012 | Katrak | ................. | H04L 9/3297 701/32.6 |
| 8,352,322 B2* | 1/2013 | Mennie | ............. | G06F 11/1064 705/16 |
| 2003/0139140 A1* | 7/2003 | Chen | ..................... | H04B 7/022 455/67.11 |
| 2010/0002821 A1 | 1/2010 | Hammerschmidt et al. | | |
| 2010/0148949 A1* | 6/2010 | McQuade | ........... | B60C 23/0415 340/442 |
| 2011/0044172 A1* | 2/2011 | Yim | ........................ | H04L 47/14 370/236 |
| 2011/0128902 A1* | 6/2011 | Guo | ...................... | G08G 1/161 370/312 |
| 2012/0226965 A1 | 9/2012 | Hammerschmidt et al. | | |
| 2012/0233498 A1* | 9/2012 | Ramaraju | ........... | G06F 11/1064 714/23 |
| 2013/0148547 A1* | 6/2013 | Page | ........................ | H04L 67/12 370/255 |
| 2013/0227368 A1* | 8/2013 | Ramaraju | ........... | G06F 11/0754 714/746 |
| 2013/0343472 A1 | 12/2013 | Scherr | | |

* cited by examiner

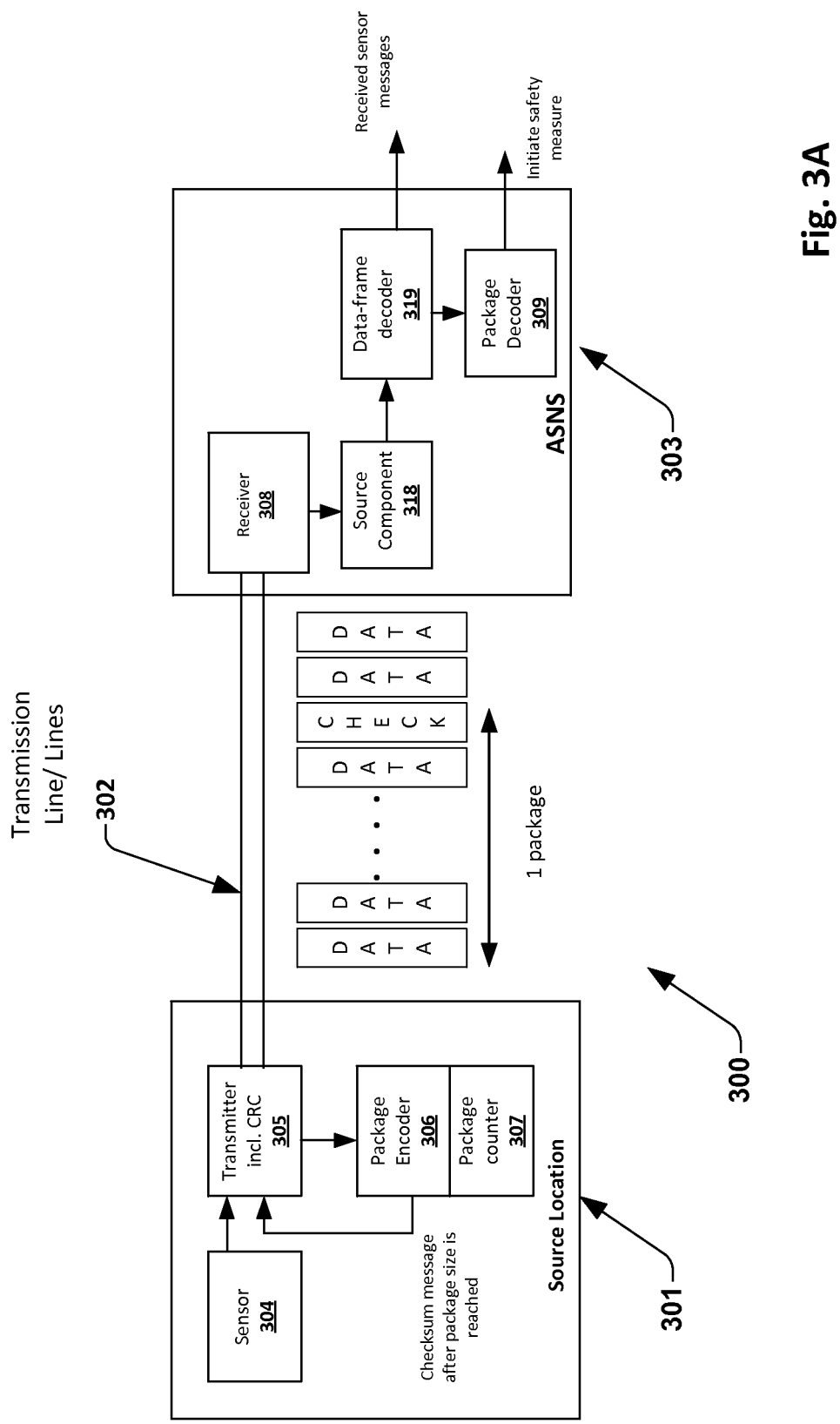

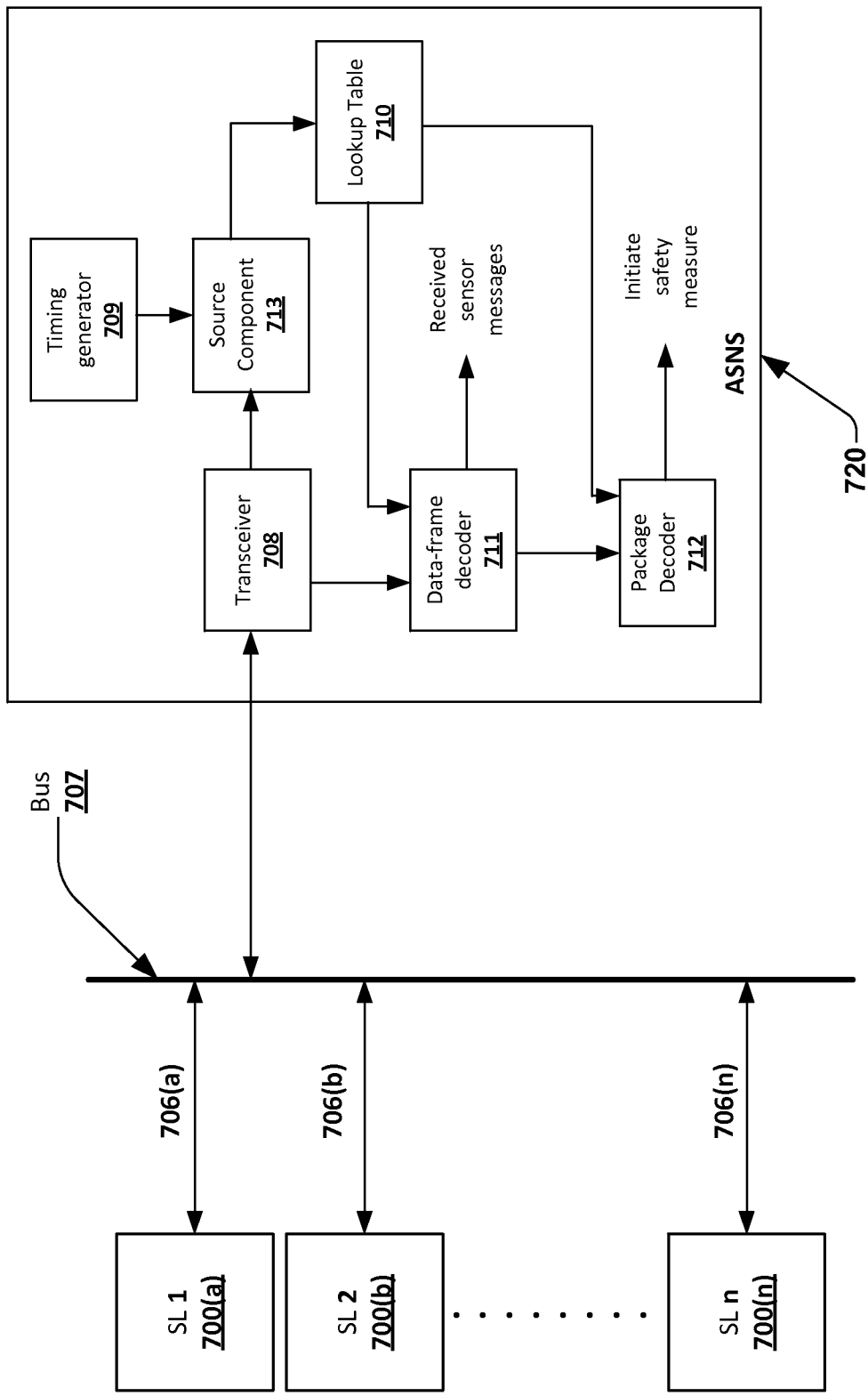

SENSOR INTERFACE THAT PROVIDES A LONG PACKAGE CRC TO IMPROVE FUNCTIONAL SAFETY

BACKGROUND

Sensor interfaces like Sent, SPC, Lin, PSI5 or DSI usually focus on the simplicity and power efficiency of the physical transmission level in order to provide cost efficient solutions. This is typically achieved by sacrificing the transmission speed. In order to keep the Net data rate of the transmission system in an acceptable range, the channel encoding is kept simple by just adding a short redundancy to the net data. For example, 3-bit CRC, 4-bit CRC, etc.

Sensor interfaces rely on the assumption that the Bit Error Rate is low due to the relatively high signaling levels that are used and can thus achieve good fault coverage with a short Cyclic Redundancy Check (CRC) or method code checksum. The performance of these short CRC is good as long as the bit error probability is kept low. However, as soon as the probability of random bit errors increase due to temporary high interference, the short CRC can no longer recognize the fault in the received bits.

SUMMARY

A data transmission system is disclosed. In accordance with one example of the invention, the system comprises of a source, one or more data transmission lines and a Communication Control System (CCS) or alternatively an Automotive Sensor Network System (ASNS). The ASNS further comprises of a transceiver, a source component, a data-frame decoder and a package decoder. The source is configured to send data-frames and a first package checksum on the transmission line. The transceiver is configured to transmit requests on the transmission line and to receive the data-frames and a first package checksum from the at least one transmission line. The data-frames include a first data-frame checksum calculated at the source. The source component is configured to generate a determination of the source from which the data-frames are received. The data-frame decoder component is configured to calculate a second data-frame checksum for the at least one data-frame by generating a first decoding method based on the determination of the source and compare the second data-frame checksum with the first data-frame checksum. If the checksums do not match, a transmission error warning is issued and required safety measures are initiated. The package decoder unit is configured to calculate a second package checksum for a plurality of data-frames received from the transceiver by generating a second decoding method based on the first and compare the second package checksum with the first package checksum.

Further, in another embodiment, multiple source locations communicating with a single Automotive Sensor Network System (ASNS) is disclosed. The multiple source locations can either be connected to the ASNS via independent transmission lines or they can be connected to the ASNS via a common bus. In case of multiple source locations connected to the ASNS via independent transmission lines, the operation is similar to the system having a single source location and a single ASNS i.e., each interface acts as an independent ASNS-source location interface. However, when the multiple source locations are connected to the ASNS via a common bus, the ASNS generates a determination of the source location from which the data-frames are received to use the appropriate decoding method to calculate the second data-frame checksum and the second package checksum.

Additionally, a method for receiving data-frames and a first package checksum from at least one source is disclosed. In accordance with a further example, the method comprises generating a determination of the source locations from which the data-frames and the package checksum are received. The method further discloses the initiation of safety measures based on the results of comparison of the first data-frame checksum and the second data-frame checksum; the first package checksum and the second package checksum.

BRIEF DESCRIPTION OF THE DRAWINGS

FIGS. 3A-3B illustrate descriptive block diagrams of a data communication system.

FIG. 7B illustrates a block diagram of a plurality of such source locations connected to the Automotive Sensor Network System via a common bus.

DETAILED DESCRIPTION

Figure 1:
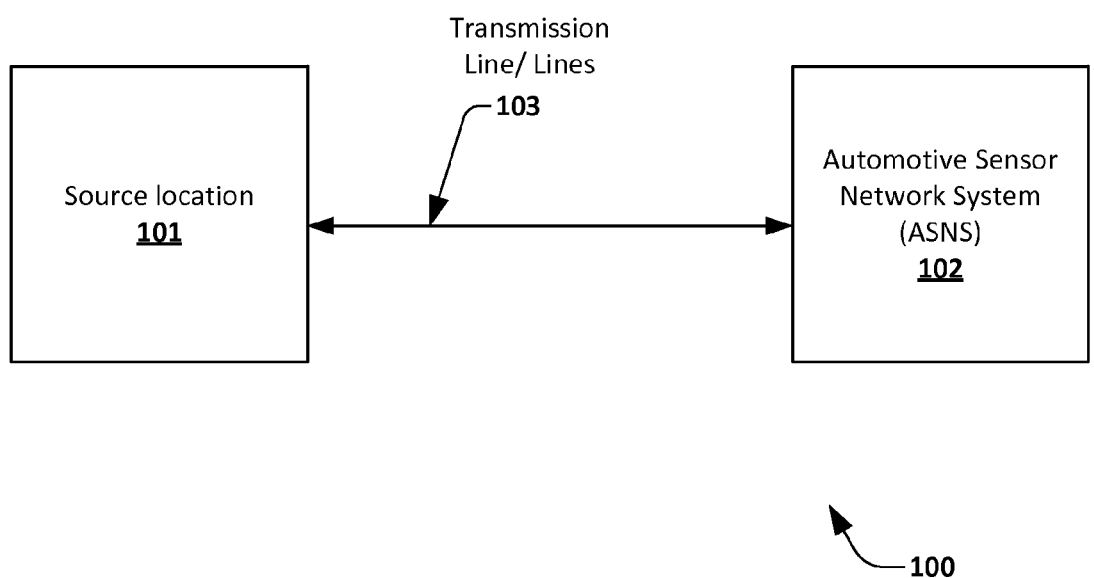
FIG. 1 illustrates a block diagram of a data communication between a source location and an Automotive Sensor Network System.

The present invention will now be described with reference to the attached drawing figures, wherein like reference numerals are used to refer to like elements throughout, and wherein the illustrated structures and devices are not necessarily drawn to scale. As utilized herein, terms "component," "system," "interface," "decoder" and the like are intended to refer to a computer-related entity, hardware, software (e.g., in execution), or firmware. For example, a component can be a processor, a process running on a processor, an object, an executable, a program, a storage device, an electronic circuit or a computer with a processing device. By way of illustration, an application running on a server and the server can also be a component. One or more components can reside within a process, and a component can be localized on one computer and/or distributed between two or more computers.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Data transmission in some communication systems such as automotive sensor networks use sensor interfaces like Sent, SPC, Lin, PS15, or other interface, for example. A desired data rate is maintained such that the cost efficiency is kept in check. The small bandwidth of the data rate limited sensor network does not allow the protection of each frame alone with a strong redundancy. To maintain the desired data rate, the channel encoding is usually kept simple by adding short redundancy to the net data such as, a parity bit, a 3-bit Cyclic Redundancy Check (CRC), a 5-bit CRC, etc. The short redundancy protection mechanisms are good as long as the bit error probability is very low. However, in the case of a temporary high interference in the transmission lines, the messages that may have been destroyed during transmission would not be recognized by the CRC. Disclosed herein is a protection scheme that adds an additional redundant code to a package (a group of data-frames) on top of the CRC of each data-frame. The code that is used for the protection of the package could be stronger than the data-frame CRC, e.g. a longer CRC of 16-Bit, 32-bit, a Reed Solomon code, a turbo code, or other redundancy code. The combination of the simple protection of single data-frames together with the package protection of a block messages is set up in a way that the safety goal is reached even for bad transmission conditions.

FIG. 1 is a block diagram that illustrates a data transmission system 100. The source location 101 is configured to send one or more data-frames and a first package checksum on the transmission lines 103. Every data-frame has its own set of redundancy bits, which is termed as a data-frame checksum. A group of multiple data-frames along with the additional higher order redundancy bits is termed as a package. The Automotive Sensor Network System (ASNS) 102 is configured to receive the data-frames and the first package checksum from the transmission lines. The ASNS is further configured to calculate a second data-frame checksum for each of the received data-frames and compare the second data-frame checksum with the first data-frame checksum. If the checksums are found to be different, the ASNS issues a warning of an unfaithful or a flawed data transmission over the transmission lines. However, the possibility of temporary high interference in the transmission lines makes it desirable to verify if the received message is indeed a transmission error or a correct message. The ASNS is further configured to calculate a second package checksum for the plurality of data-frames received and compare the calculated second package checksum with the first package checksum. If the checksums are found to be different, the ASNS issues a warning indicating the unfaithful data transmission over the transmission lines.

Figure 2:
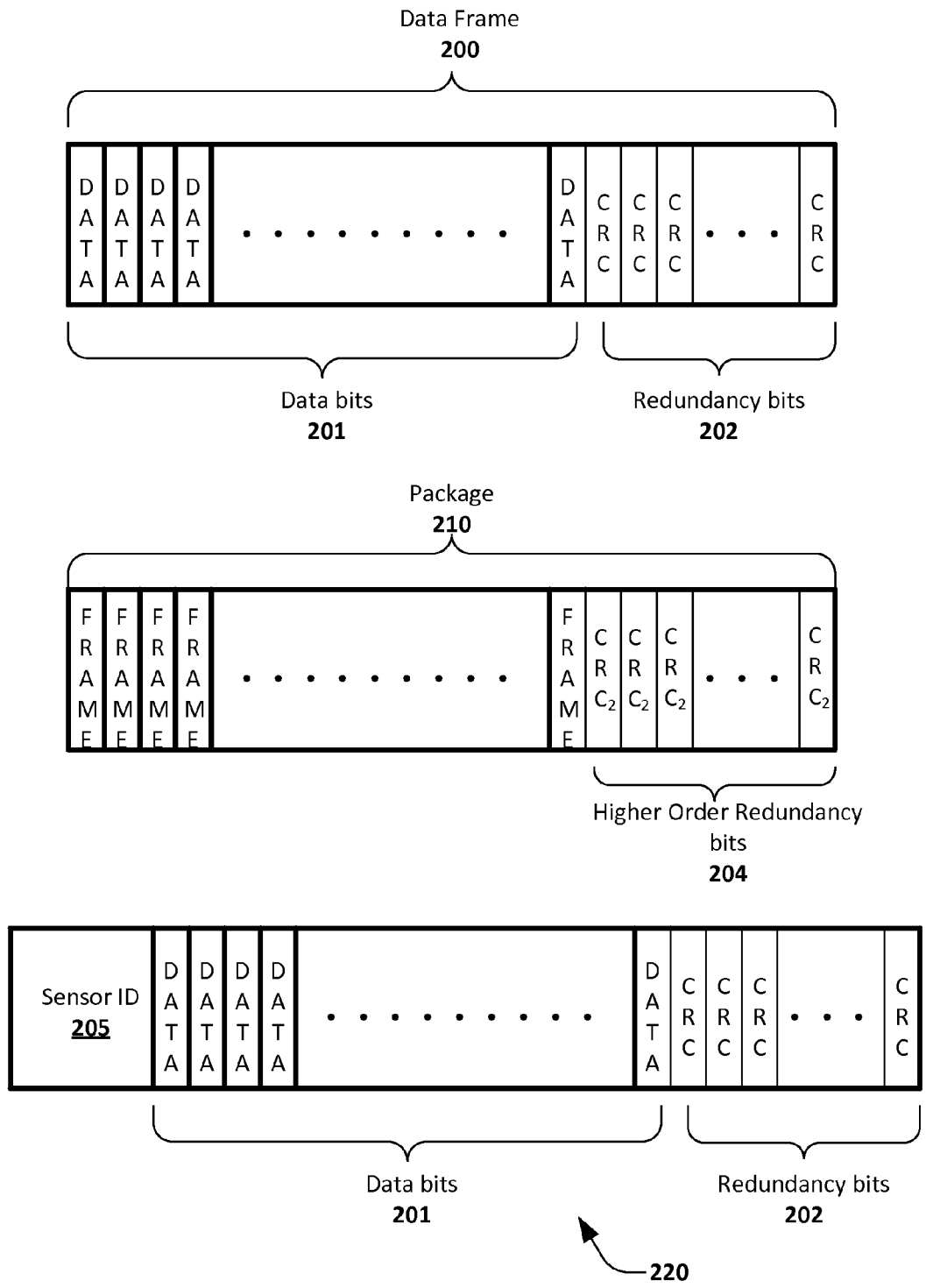
FIG. 2 illustrates a data-frame, a package and a data-frame with sensor ID.

FIG. 2 discloses the contents of a data-frame and a package. A data-frame 200 contains a series of data bits 201 in addition to the redundancy bits 202 required for the protection of data-frame. These redundancy bits 202 can be of a smaller order in order to keep an efficient net data rate. The package 210 contains a group of data-frames 203 (each data-frame has its own redundancy bits as described above) in addition to the higher order redundancy bits 204 for the protection of the package 210. In some cases, the data-frame 220 can also contain a series of bits which represent the sensor ID 205 in addition to the data bits 201 and the redundancy bits 202.

FIG. 3A illustrates a data transmission system 300, which comprises of a source location 301, transmission lines 302 and an Automotive Sensor Network System (ASNS) 303. The source location 301 further contains a sensor 304, a transmitter 305, a package encoder 306 and a package counter 307. The sensor 304 sends the data bits to the transmitter 305. The transmitter 305 calculates the first data-frame checksum for each set of data bits from the sensor 304 and transmits the data-frame, which now includes the data bits and the calculated first data-frame checksum on the transmission line 302. The transmitter 305 also sends the data-frame to the package encoder 306. The package encoder 306 is configured to calculate the first package checksum for a predetermined number of data-frames. The package counter 307 counts the number of data-frames that enter the package encoder 306. Once the count in the package counter 307 reaches the predetermined number, the calculated first package checksum is sent to the transmitter 305, which further transmits the first package checksum on to the transmission line 302.

The ASNS 303 comprises a receiver 308, a source component 318, a data-frame decoder 319 and a package decoder 309. The receiver 308 is configured to receive the data-frames from the transmission lines 302. The received data frames are sent to the source component 318. The source component 318 is configured to generate a determination of the source location from which the data-frames are received. The data-frames that contain the first data-frame checksums are forwarded to the data-frame decoder 319. The data-frame decoder 319 is configured to calculate a second data-frame checksum for the data-frames received by generating a first decoding method based on the determination of the source and compare the second data-frame checksum with the first data-frame checksum. The data-frame decoder is configured to output the received sensor messages and notify the fidelity of the transmission based on the results of comparison. The data-frame decoder 319 further sends the data-frames to the package decoder 309. The package decoder 309 is configured to calculate a second package checksum based on the data-frames received. The number of data-frames over which the package decoder 309 calculates the receiver location package checksum is the same as the number of data-frames used to calculate the first package checksum. The package decoder 309 is further configured to compare the first package checksum and the second package checksum. If the checksums are not equal, the package decoder 309 initiates a safety measure.

Figure 3B:
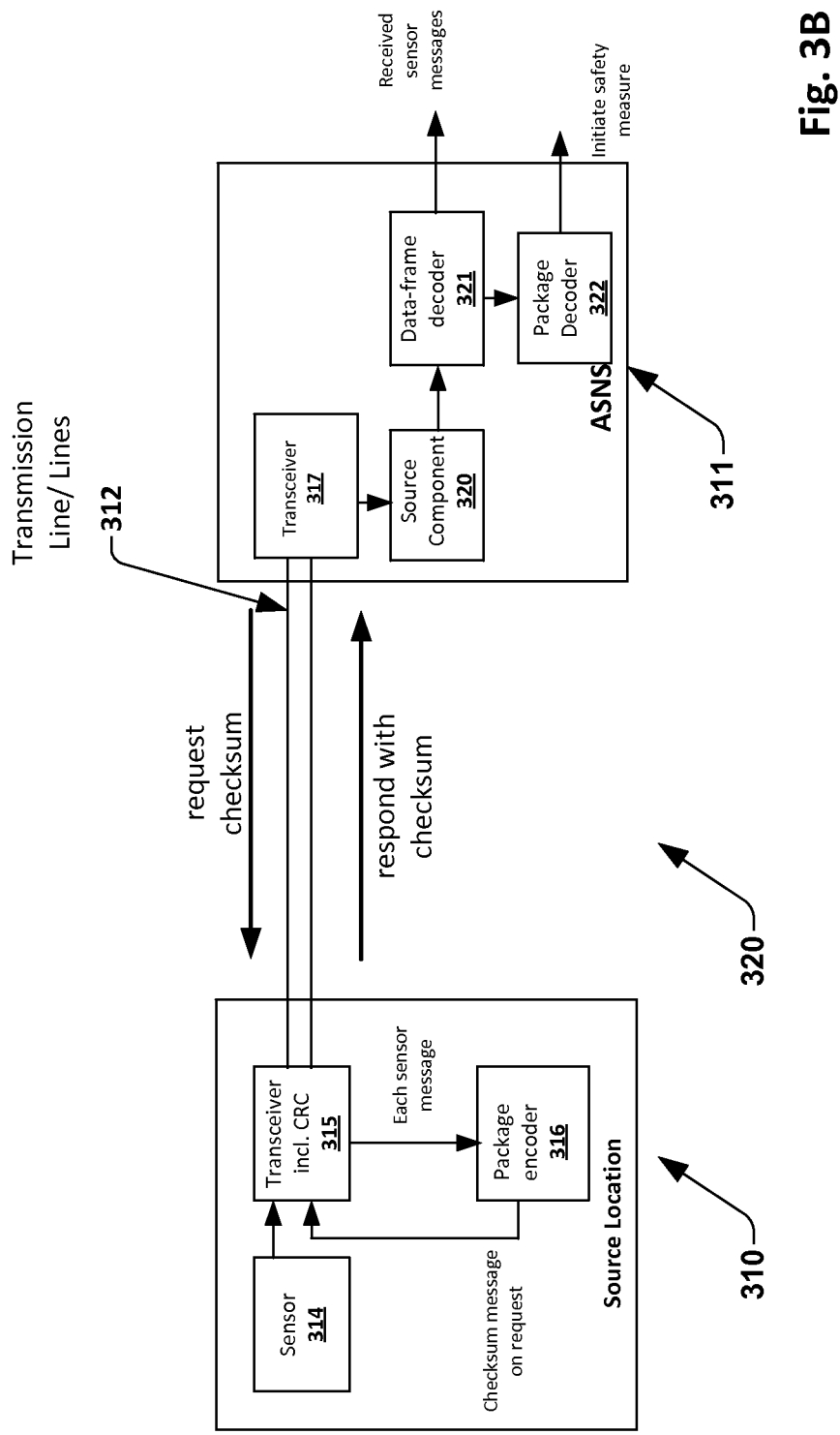

FIG. 3B discloses another embodiment of a data transmission system 320 which has a source location 310, transmission lines 312 and an Automotive Sensor Network System (ASNS) 311. The source location 310 further comprises of a sensor 314, a transceiver 315 and a package encoder 316. The sensor 314 sends the data bits to the transceiver 315. The transceiver 315 calculates the first data-frame checksum for each set of data bits from the sensor 314 and transmits the data-frame which now includes the data bits and the calculated first data-frame checksum on the transmission line 312. The transceiver 315 also sends the data-frame to the package encoder 316. The package encoder 316 is configured to calculate the first package checksum for a plurality of data-frames.

The ASNS 311 comprises of a transceiver 317, a source component 320, a data-frame decoder 321 and a package decoder 322. The transceiver 317 is configured to receive the data-frames from the transmission lines 312. The received data frames are sent to the source component 320. The source component 320 is configured to generate a determination of the source location from which the data-frames are received. The data-frames which contain the first data-frame checksums are forwarded to the data-frame decoder 321. The data-frame decoder 321 is configured to calculate a second data-frame checksum for the data-frames received by generating a first decoding method based on the determination of the source and compare the second data-frame checksum with the first data-frame checksum. The data-frame decoder is configured to output the received sensor messages and notify the fidelity of the transmission based on the results of comparison. The data-frame decoder 321 further sends the data-frames to the package decoder 322.

The ASNS 311 of FIG. 3B sends a request to the source location 310 via the transmission lines 312 to respond with the first package checksum. When the request is received by the source location 310, the package encoder 316 sends the calculated first package checksum to the transceiver 315. The transceiver 315 responds to the ASNS 311 with the first package checksum. The package decoder 322 is configured to calculate the ASNS location package checksum based on the data-frames received. The number of data-frames over which the package decoder 322 calculates the second package checksum is the same as the number of data-frames used to calculate the first package checksum. The package decoder 321 is further configured to compare the first package checksum and the calculated second package checksum. If the checksums are not equal, then the package decoder 322 initiates a safety measure.

Figure 4A:
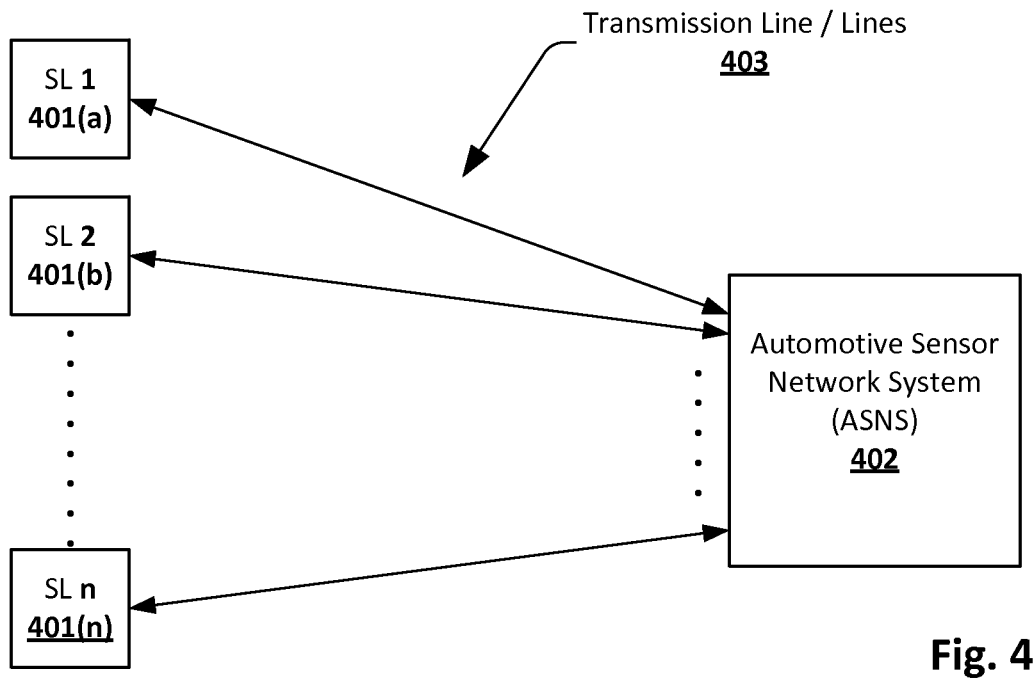
FIGS. 4A-4B illustrate different ways of data communication between multiple source locations and an Automotive Sensor Network System.
Figure 4B:
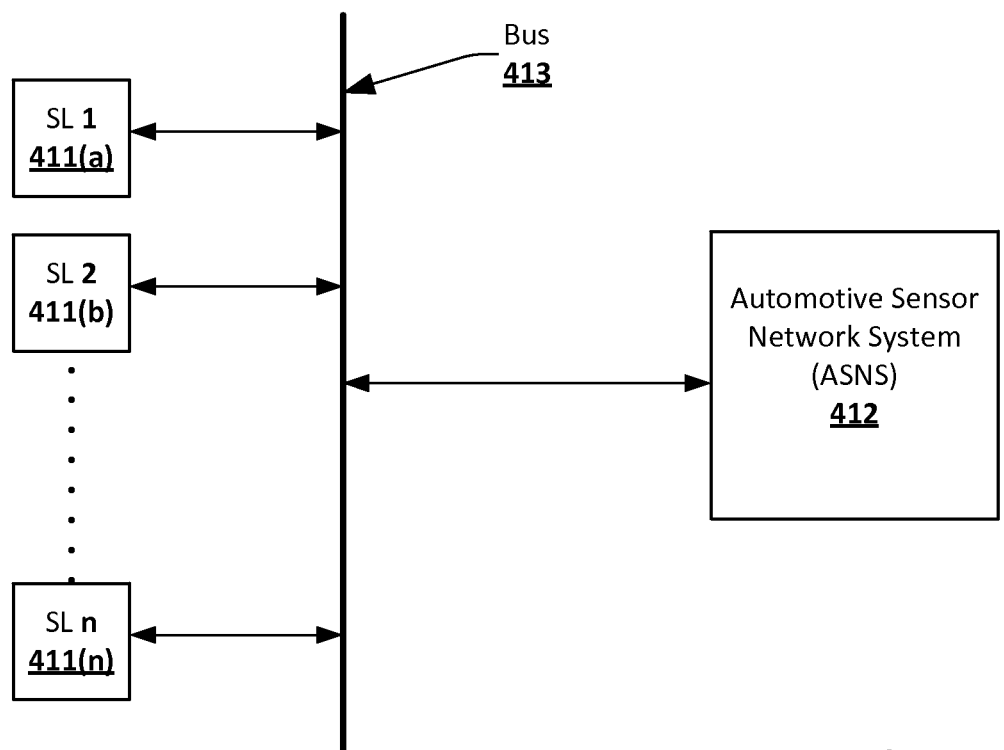

Data transmission systems with multiple source locations and a single ASNS are disclosed. FIG. 4A and FIG. 4B illustrate two ways of how multiple source locations can be connected to the Automotive Sensor Network System (ASNS) 402. In FIG. 4A the multiple source locations 401(a)-401(n) are connected to the ASNS 402 via independent transmission lines 403. The ASNS 402 thus treats each source location as an independent source location and the operation of the sensor — ASNS interface is as appreciated above in the paragraphs.

FIG. 4B discloses an embodiment wherein the source locations 411(a)-411(n) are connected to the ASNS 412 via a common bus 413. The source locations 411(a)-411(n) transmit respective data-frames (which comprises of data bits and a first data-frame checksum) and respective first package checksums onto the common bus 413. The ASNS 412 receives the transmitted data-frames and first package checksums from the common bus 413. The working of an ASNS when connected to multiple sensors is appreciated below.

Figure 5A:
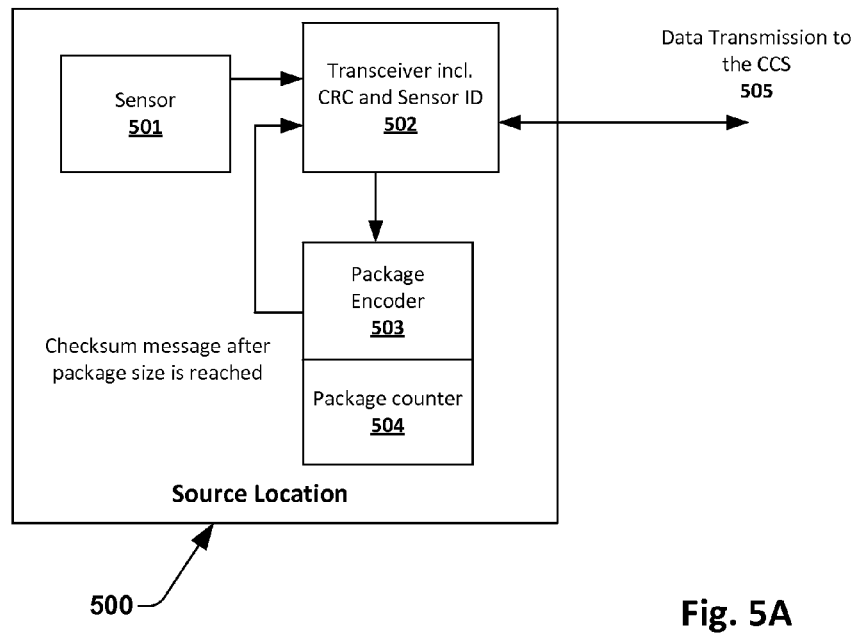
FIG. 5A illustrates a block diagram of a source location configured to send data-frames onto the transmission line.
Figure 5B:
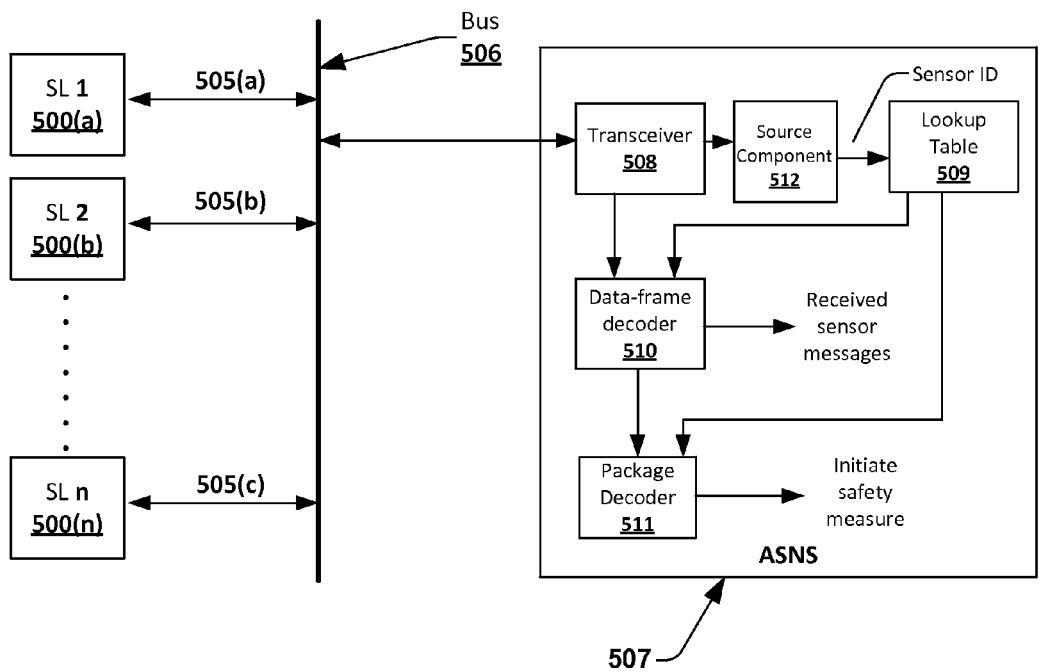
FIG. 5B illustrates a block diagram of a plurality of source locations connected to an Automotive Sensor Network System via a common bus.

In response to a ASNS 507 being communicatively connected to multiple source locations 501(a)-501(b) via a common bus 506, the ASNS 507 generates the determination of the source location from which the data-frames and the first package checksums are being received in order to use the appropriate decoding methods for the data-frame checksum and the package checksum. The first data-frame checksum and the first package checksum are either calculated using the same decoding method or using different decoding methods. Therefore, in order to calculate the second data-frame checksums and the second package checksums of the received data-frames at the ASNS 507, appropriate decoding methods need to be used. FIG. 5A-5B illustrate an embodiment wherein the ASNS 507 generates the determination of the source component from which the data-frames are received by checking the sensor ID of each data-frame and using the respective decoding method.

FIG. 5A discloses a source location 500 which has a sensor 501, a transceiver 502, a package encoder 503, a package counter 504 and data transmission lines 505. The transceiver 502 calculates the first data-frame checksum for each set of data bits from the sensor 501 and transmits the data-frame (which now includes the data bits and the calculated first data-frame checksum) and the sensor ID on the transmission lines 505. The transceiver 502 also sends the data-frame to the package encoder 503. The package encoder 503 is configured to calculate the first package checksum for a predetermined number of data-frames. The package counter 504 counts the number of data-frames that enter the package encoder 503. Once the count in the package counter 504 reaches the predetermined number, the calculated first package checksum is sent to the transceiver 502 which further transmits the first package checksum on the transmission line 505.

FIG. 5B discloses the interface of the multiple source locations 500(a)-500(n) with ASNS 507. The source locations 500(a)-500(n) are connected to the common bus 506 via the transmission lines 505(a)-505(n) respectively. The ASNS 507 comprises of a transceiver 508, a source component 512 a look up table 509, a data-frame decoder 510 and a package decoder 511. The bus 506 is connected to the transceiver 508. The data-frames and the first package checksums on the bus are from a plurality of source locations 500(a)-500(n) connected to the bus 506. The transceiver 508 is configured to receive the data-frames and the first package checksums from the bus 506. The transceiver 508 further sends the sensor ID to the look up table 509. The source component 512 generates the determination of the source location from which the data-frames and the first package checksums were received by checking the sensor ID. The look-up table 509 contains the data-frame checksum decoding methods and the package checksum decoding methods for every sensor connected to the ASNS 507. The look up table 509 is configured to receive the sensor ID from the transceiver 508 and output the data-frame checksum decoding method and the package checksum decoding method based on the sensor ID obtained from the transceiver 508. The data-frame decoder 510 is configured to receive the data-frames from the transceiver 508 and calculate a second data-frame checksum for the data-frames received by using the data-frame decoding method obtained from the look-up table 509. The data-frame decoder 510 is further configured to compare the calculated second data-frame checksum with the first data-frame checksum. The data-frame decoder 510 is configured to output the received sensor messages and notify the fidelity of the transmission based on the results of comparison. The data-frame decoder 510 further sends the data-frames to the package decoder 511. The package decoder 511 is configured to calculate the second package checksum based on the data-frames received using the appropriate package decoding method from the look up table 509. The number of data-frames over which the package decoder 511 calculates the receiver location package checksum is the same as the number of data-frames used to calculate the respective first package checksum. If the checksums are not equal, the package decoder 511 initiates a safety measure.

Figure 6:
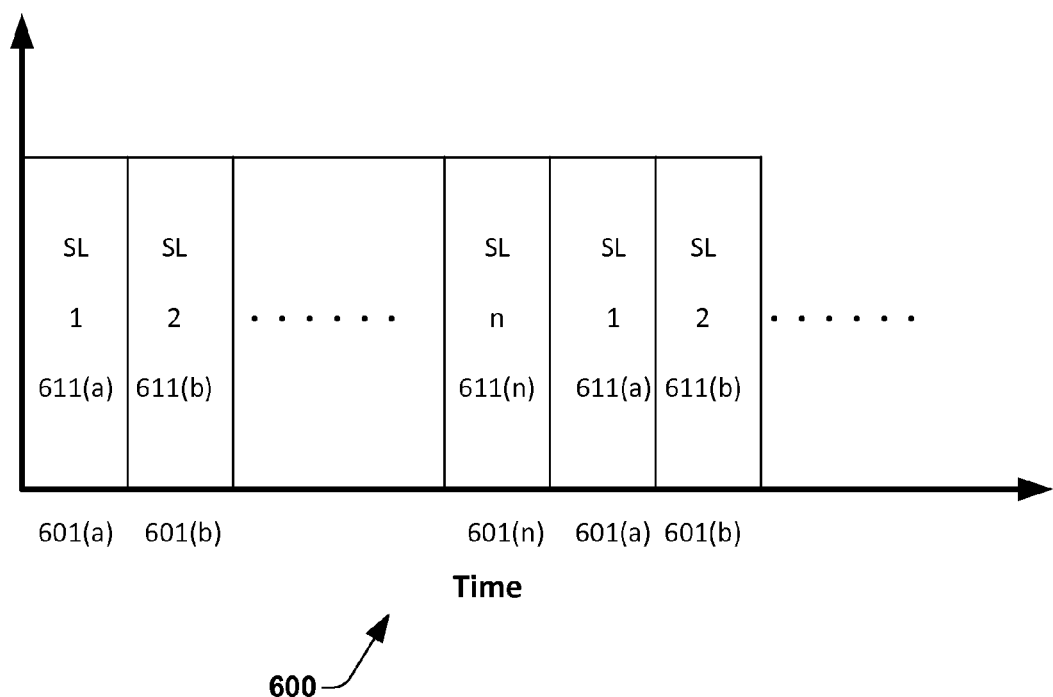
FIG. 6 illustrates a timing diagram wherein time slots are allotted to each source location during which the data-frames are to be sent on to the data transmission line/lines.

In another embodiment, the transceiver generates the determination of the source location from which the data-frames and the first package checksums are received based on the time frame in which the data-frames are received. Every source location is assigned a specific time frame during which it transfers the data-frames and the package checksums on the bus. FIG. 6 gives an example of how multiple source locations 611(a)-611(n) are assigned different time slots 601(a)-601(n) to transmit data to the bus. Once the source location 611(n) completes its transfer during the time slot 601(n), the sensor 611(a) transmits data to the bus during the time slot 602(a) and so on. It should be noted that the time slots allotted to the sensors might not be in a cyclic manner as it might not be necessary to read from every sensor in regular intervals.

Figure 7A:
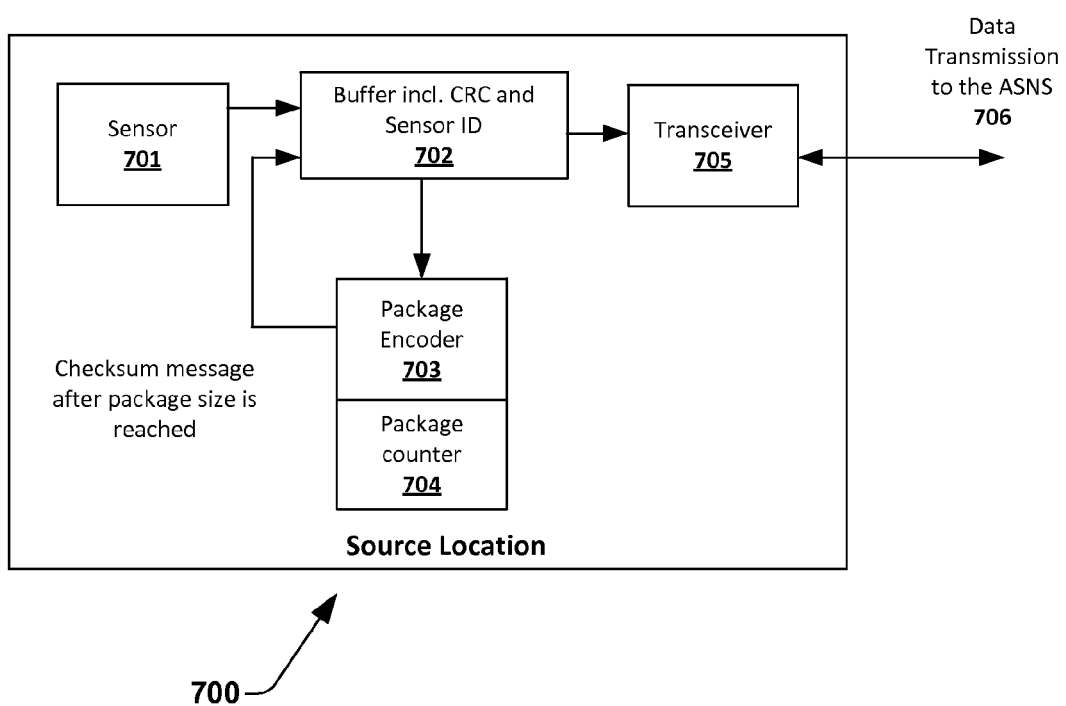
FIG. 7A illustrates a block diagram of a source location configured to send data-frames onto the transmission line at the allotted time.

FIG. 7A-7B illustrate another embodiment wherein the ASNS 720 is connected to multiple source locations 700(a)-700(n) via a common bus 707, wherein the source component 713 generates a determination of the source location based on the time slot in which the ASNS 720 receives the data-frames and the first package checksums. FIG. 7a shows a source location 700 which has a sensor 701, a buffer 702, a package encoder 703, a package counter 704, a transceiver 705 and data transmission lines 706. The buffer 702 calculates the first data-frame checksum for each set of data bits from the sensor 701 and sends the data-frame (which now includes the data bits and the calculated first data-frame checksum) and the sensor ID to the transceiver 705. The buffer 702 also sends the data-frame to the package encoder 703. The package encoder 703 is configured to calculate the first package checksum for a predetermined number of data-frames. The package counter 704 counts the number of data-frames that enter the package encoder 703. Once the count in the package counter 704 reaches the predetermined number, the calculated first package checksum is sent to the buffer 702 which further sends the first package checksum to the transceiver 705. The transceiver 705 further transmits the data-frames and the first package checksum on to the data transmission lines 706 during the assigned time slot.

FIG. 7B shows the interface of the multiple source locations 700(a)-700(n) with ASNS 720. The source locations 700(a)-700(n) are connected to the common bus 707 via the transmission lines 706(a)-706(n) respectively. The ASNS 720 further comprises of a transceiver 708, a source component 713, a timing generator 709, a data-frame decoder 711, a look up table 710 and a package decoder 712. The bus 707 is connected to the transceiver 708. The transceiver 708 is configured to receive the data-frames and the first package checksums from the bus 707. The data-frames and the first package checksums on the bus are from a plurality of source locations 700(a)-700(n) connected to the bus 707. The source component 713 generates the determination of the source location from which the data-frames and the first package checksums were received by checking for the time slots during which the data is being received. The timing for the transceiver 708 is provided by the timing generator 709. The source component 713 further sends the timing information to the look up table 710. The look up table 710 contains the data-frame checksum decoding methods and the package checksum decoding methods for every source location connected to the ASNS 720. The look up table 710 is configured to receive the timing information from the source component 713 and output the data-frame checksum decoding method and the package checksum decoding method based on the time slot during which the data-frames are being received. The data-frame decoder 711 is configured to receive the data-frames from the transceiver 708 and calculate a second data-frame checksum for the data-frames received by using the data-frame decoding method obtained from the look-up table 710. The data-frame decoder 711 is further configured to compare the calculated second data-frame checksum with the first data-frame checksum. The data-frame decoder is configured to output the received sensor messages and notify the fidelity of the transmission based on the results of comparison. The data-frame decoder 711 further sends the data-frames to the package decoder 712. The package decoder 712 is configured to calculate a second package checksum based on the data-frames received using the appropriate package decoding method from the look up table 710. The number of data-frames over which the package decoder 712 calculates the receiver location package checksum is the same as the number of data-frames used to calculate the respective first package checksum. If the checksums are not equal, the package decoder 712 initiates a safety measure.

Figure 8:
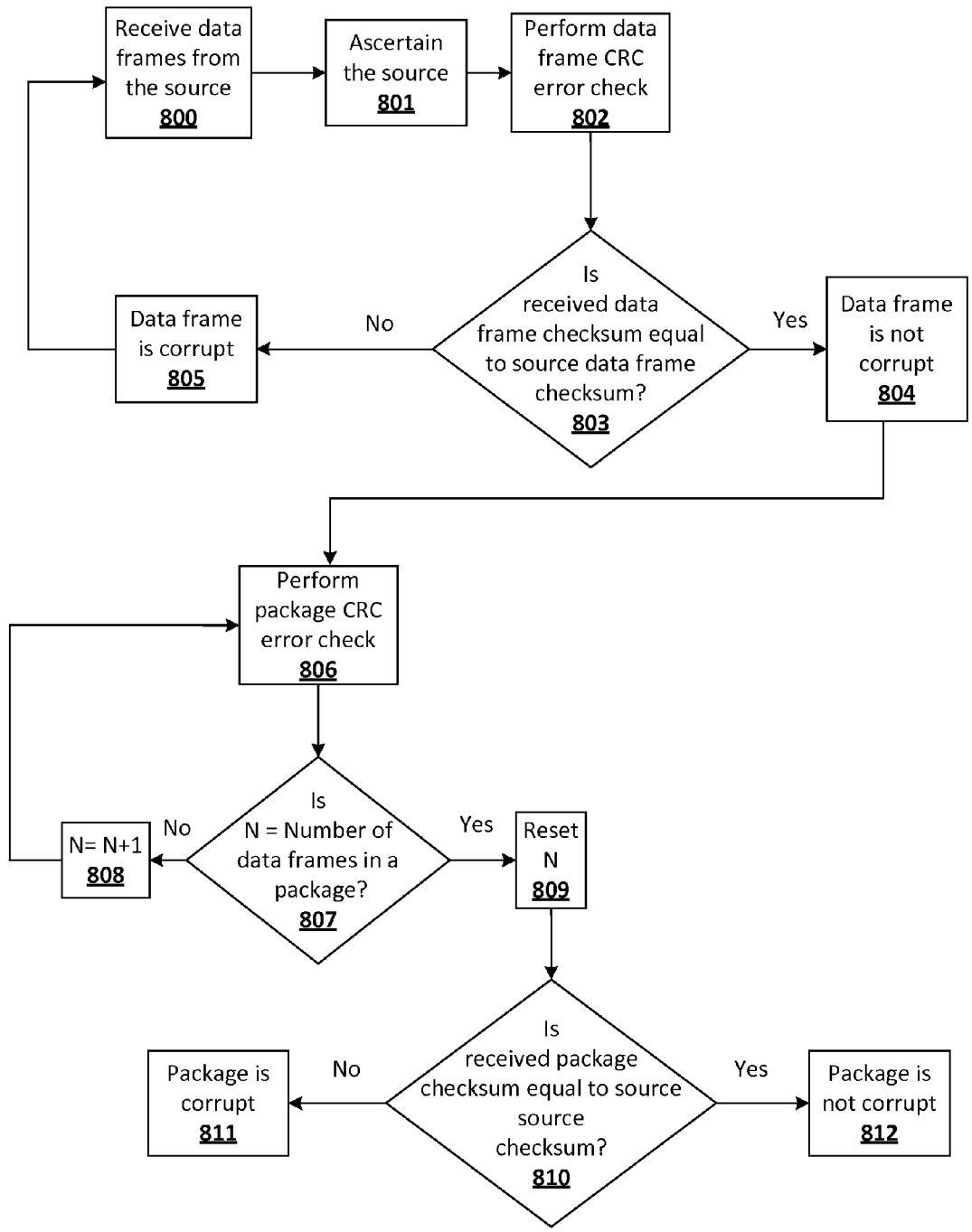
FIG. 8 illustrates a flow diagram of a method for a functionally safe verification of the received data-frames from one or more sensors.

A method for generating a determination of the source location and performing a higher order redundancy check to avoid safety critical failure in case of multiple source locations connected to the ASNS is disclosed. FIG. 8 illustrates a flow diagram of an ASNS which generates a determination of the source location and performs a CRC check in multiple levels. An example in the field of automobiles is discussed. There are multiple sensors in an automobile such as temperature sensor, tire pressure sensor, accelerometer and so on. These sensors which are placed at different locations of the automobile communicate with the ASNS via a common bus. These sensors send their data-frames and the first package checksum to the ASNS through the common bus. The ASNS generates the determination of the source location from which the data-frames are being received and uses the appropriate method required to calculate the ASNS location data-frame checksum and the ASNS location package checksum for the corresponding sensor and as discussed before, compares these calculated checksums with the corresponding first data-frame checksum and the first package checksum. Based on the results of comparison, the ASNS outputs whether there was faithful data transmission from the sensors to the ASNS.

Although the invention has been illustrated and described with respect to one or more implementations, alterations and/or modifications may be made to the illustrated examples without departing from the spirit and scope of the appended claims.

The term "computer readable media" as used herein includes computer readable storage media and communication media. Computer readable storage media includes volatile and nonvolatile, removable and non-removable media implemented in any method or technology for tangible storage of information such as computer readable instructions or other data. Data stores or memory disclosed herein are examples of computer readable storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium, which can be used to store the desired information.

The term "computer readable media" may also include communication media. Communication media typically embodies computer readable instructions or other data that can be communicated in a "modulated data signal" such as a carrier wave or other transport mechanism and includes any information delivery media. The term "modulated data signal" may include a signal that has one or more of its characteristics set or changed in such a manner as to encode information in the signal.

One or more of the operations described can constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein Moreover, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An automotive sensor network system to detect communication faults in a communication link and avoid safety critical failure, the automotive sensor network system comprising:
   a transceiver configured to receive at least one data-frame and a first package checksum from a source location, wherein the at least one data-frame includes a first data-frame checksum calculated at the source location;
   a source component configured to generate a determination of the source location from which the at least one data-frame is received;
   a data-frame decoder component configured to calculate a second data-frame checksum for the at least one data-frame by generating a first decoding method based on the determination of the source and compare the second data-frame checksum with the first data-frame checksum; and
   a package decoder component configured to calculate a second package checksum for a plurality of the data-frames received from the transceiver by generating a second decoding method based on the source location and compare the second package checksum with the first package checksum.

2. The automotive sensor network system of claim 1, wherein the source location is a sensor which is either a steering torque sensor, a steering angle sensor, an electrical gas pedal sensor, a throttle valve sensor, a manifold air pressure sensor, an airbag pressure sensor or an airbag accelerometer.

3. The automotive sensor network system of claim 1, wherein the package decoder component is further configured to update the second package checksum on receiving at least one data-frame from the transceiver.

4. The automotive sensor network system of claim 1, further comprising a look-up table configured to output a data-frame decoding method and a package decoding method based on the determination of the source location by the transceiver.

5. The automotive sensor network system of claim 4, wherein the look-up table comprises of polynomial checksums or non-polynomial checksums.

6. The automotive sensor network system of claim 5, wherein the data-frame decoder component generates the second data-frame checksum based on information within the at least one data-frame received at the transceiver.

7. The automotive sensor network system of claim 6, wherein the data-frame decoder component generates the second data-frame checksum using a cyclic redundancy check (CRC).

8. The automotive sensor network system of claim 7, wherein the decoding method used to generate the second data-frame checksum is the data-frame decoding method obtained from the look-up table based on the determination of the source location of the at least one received data-frame.

9. The automotive sensor network system of claim 6, wherein the data-frame decoder component is further configured to output a message based on the results of the comparison.

10. The automotive sensor network system of claim 5, wherein the package decoder component generates a second package checksum based on information within a plurality of data-frames received at the transceiver.

11. The automotive sensor network system of claim 10, wherein the package decoder generates the second package checksum using a cyclic redundancy check (CRC),
    wherein the length of the second package checksum is greater than the length of the second data-frame checksum.

12. The automotive sensor network system of claim 11, wherein the decoding method used to generate the second package checksum is the package decoding method obtained from the look-up table based on the determination of the source location of the at least one received data-frame.

13. The automotive sensor network system of claim 10, wherein the package decoder component is further configured to output a message based on the results of the comparison within a fault tolerant time of the Automotive Sensor Network System.

14. The automotive sensor network system of claim 4, wherein the package decoding method is configured to detect higher order multi-bit faults in comparison to the data-frame decoding method.

15. The automotive sensor network system of claim 14, wherein the package decoding method is configured to use a checksum which is Low Density Parity Check, Turbo Code or Reed Solomon code.

16. The automotive sensor network system of claim 14, wherein the data-frame decoding method is configured to use a checksum which is either Cyclic Redundancy Check or Hamming Code.

17. The automotive sensor network system of claim 1, wherein the transceiver is configured to receive a plurality of data-frames from a source location in a time slot allotted to that source location.

18. The automotive sensor network system of claim 1, wherein the source component is configured to generate the determination of the source location based on a time slot during which the data-frames are received.

19. The automotive sensor network system of claim 1, wherein the source component is configured to generate the determination of the source location based on a plurality of source identification bits attached to the data-frames received.

20. The automotive sensor network system of claim 1, wherein the transceiver is configured to receive the package checksum from the source location on sending a request to the source location.

21. A method for a communication device comprising:
receiving at least one data-frame and a first package checksum from a source location, wherein the at least one received data-frame includes a first data-frame checksum calculated at the source location;
generating a determination of the source location from which the at least one data-frame is received;
calculating a second data-frame checksum for the at least one received data-frame by generating a first decoding method based on the determination of the source location and comparing the calculated second data-frame checksum with a first data-frame checksum; and
calculating a second package checksum for a plurality of data-frames received by generating a second decoding method based on the determination of the source location and comparing the calculated second package checksum with the first package checksum.

22. The method of claim 21, wherein generating the determination of the source location based on a time slot during which them data-frame is received.

23. The method of claim 21, wherein generating the determination of the source location based on a plurality of source identification bits attached to the at least one data-frame received.

24. The method of claim 21, further comprising:
obtaining a data-frame decoding method and a package decoding method from a look-up table based on the determination of the source location.

25. A communication device, comprising:
a memory storing executable instructions; and
a processor, communicatively coupled to the memory, configured to execute the executable instructions to perform operations to at least:
receive at least one data-frame and a first package checksum from a source location, wherein the at least one received data-frame includes a first data-frame checksum calculated at the source location;
generate a determination of the source location from which the at least one data-frame is received;
calculate a second data-frame checksum for the at least one received data-frame by generating a first decoding method based on the determination of the source location;
compare the second data-frame checksum with the first data-frame checksum; and
a calculate a second package checksum for a plurality of the data-frames received by generating a second decoding method based on the source location and compare the second package checksum with the first package checksum.

26. The communication device of claim 25, wherein the processor is further configured to execute the executable instructions to:
receive a plurality of data-frames from a source location in a time slot allotted to that source location.

27. The communication device of claim 26, wherein the processor is further configured to execute the executable instructions to:
generate an determination of the source location based on a time slot during which the data-frames are received.

28. The communication device of claim 27, wherein the processor is further configured to execute the executable instructions to:
generate an determination of the source location based on a plurality of source identification bits attached to the data-frames received.

29. The communication device of claim 28 wherein the processor is further configured to execute the executable instructions to:
generate, via a look-up table, a data-frame decoding method and a package decoding method based on the determination of the source location.

* * * * *